(12) United States Patent
Miyahara (10) Patent No.: US 10,242,792 B2
(45) Date of Patent: Mar. 26, 2019

(54) MULTILAYER ELECTRONIC COMPONENT

(71) Applicant: Murata Manufacturing Co., Ltd., Nagaokakyo-shi, Kyoto-fu (JP)

(72) Inventor: Kunihiro Miyahara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 9 days.

(21) Appl. No.: 15/597,205

(22) Filed: May 17, 2017

(65) Prior Publication Data

US 2017/0338030 A1 Nov. 23, 2017

(30) Foreign Application Priority Data

May 20, 2016 (JP) .................... 2016-101845
Nov. 30, 2016 (JP) .................... 2016-233133

(51) Int. Cl.
*H01F 27/29* (2006.01)
*H01F 27/36* (2006.01)
(Continued)

(52) U.S. Cl.
CPC ..... *H01F 27/2885* (2013.01); *H01F 17/0013* (2013.01); *H01F 27/2804* (2013.01); *H01F 27/29* (2013.01); *H01F 27/292* (2013.01); *H01G 2/22* (2013.01); *H01G 4/012* (2013.01); *H01G 4/232* (2013.01); *H01G 4/30* (2013.01); H01F 2017/008 (2013.01); H01F 2017/0026 (2013.01); H01F 2027/2809 (2013.01);
(Continued)

(58) Field of Classification Search
CPC ............. H01F 27/2885; H01F 27/2804; H01F 27/292; H01F 27/29; H01F 2027/2809; H01F 17/0013; H01F 2017/0026; H01F 2017/008; H01F 2017/002; H01G 4/232; H01G 4/012; H01G 4/30; H01G 7/0015; H03H 1/00; H03H 2001/0085; H02G 2/22
USPC .......... 336/84 C, 192, 200; 333/134, 204, 25
See application file for complete search history.

(56) References Cited

U.S. PATENT DOCUMENTS 6,583,687 B2 * 6/2003 Nosaka .................... H03H 7/09
333/175
6,914,500 B2 * 7/2005 Hirabayashi ............ H01P 1/203
333/204

(Continued)

FOREIGN PATENT DOCUMENTS

JP 2000-261271 A 9/2000
JP 2002-76807 A 3/2002

*Primary Examiner* — Mang Tin Bik Lian
(74) *Attorney, Agent, or Firm* — Keating & Bennett, LLP (57) ABSTRACT

A multilayer body includes a first pattern conductor, and first and second via conductors. A first end of the first via conductor is electrically coupled with a second signal electrode, and a second end thereof is electrically coupled with the first pattern conductor. A first end of the second via conductor is electrically coupled with the first pattern conductor. The first pattern conductor extends such that a distance between the second via conductor and a second shield electrode is larger than a distance between the first via conductor and the second shield electrode, a distance between the second via conductor and a third shield electrode is larger than a distance between the first via conductor and the third shield electrode, and a coupling portion between the second via conductor and the first pattern conductor is outside an area of the second signal electrode.

20 Claims, 7 Drawing Sheets

(51) Int. Cl.
*H01F 27/28* (2006.01)
*H01G 4/012* (2006.01)
*H01G 4/232* (2006.01)
*H01G 4/30* (2006.01)
*H01F 17/00* (2006.01)
*H01G 2/22* (2006.01)
*H03H 1/00* (2006.01)
*H03H 7/01* (2006.01)

(52) U.S. Cl.
CPC ............ *H03H 1/00* (2013.01); *H03H 7/0115* (2013.01); *H03H 2001/0085* (2013.01)

(56) References Cited

U.S. PATENT DOCUMENTS

| | | | |
|---|---|---|---|
| 7,183,872 B2 * | 2/2007 | Lee | H01P 5/10 333/25 |
| 2007/0085108 A1 * | 4/2007 | White | H01L 23/552 257/173 |
| 2013/0257576 A1 * | 10/2013 | Arata | H01F 27/2804 336/200 |

* cited by examiner

MULTILAYER ELECTRONIC COMPONENT

CROSS REFERENCE TO RELATED APPLICATIONS

This application claims the benefit of priority to Japanese Patent Application No. 2016-233133 filed on Nov. 30, 2016 and Japanese Patent Application No. 2016-101845 filed on May 20, 2016. The entire contents of this application are hereby incorporated herein by reference.

BACKGROUND OF THE INVENTION

1. Field of the Invention

The present invention relates to multilayer electronic components, or more particularly relates to a multilayer electronic component including an outer electrode provided on a bottom surface of a multilayer body that is an electronic component element body, and a shield electrode on a side surface of the multilayer body.

2. Description of the Related Art

An example of a conventional multilayer electronic component including a shield electrode on a side surface of the multilayer body is described in Japanese Unexamined Patent Application Publication No. 2002-76807.

Figure 9:
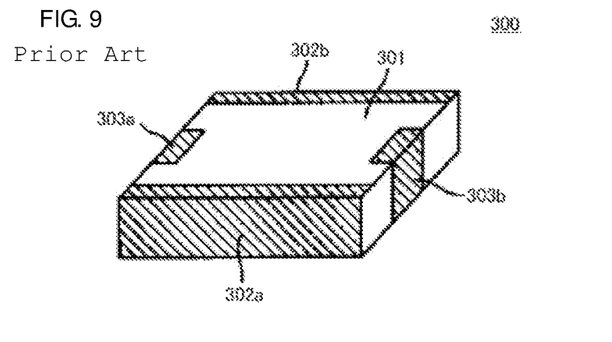
FIG. 9 is an external perspective view of a conventional multilayer electronic component.

FIG. 9 is an external perspective view of a multilayer electronic component 300 described in Japanese Unexamined Patent Application Publication No. 2002-76807. The multilayer electronic component 300 includes a multilayer body 301, a first shield electrode 302a and a second shield electrode 302b, and a first outer electrode 303a and a second outer electrode 303b.

The multilayer body 301 has a substantially rectangular-parallelepiped shape. The first shield electrode 302a is provided on one of two side surfaces facing in a short-side direction of the multilayer body 301. The second shield electrode 302b is provided on the other. Also, the first outer electrode 303a is provided on one of two side surfaces facing in a long-side direction of the multilayer body 301. The second outer electrode 303b is provided on the other.

Regarding the inner structure of the multilayer body 301, although not shown, pattern conductors and via conductors form a plurality of inductors. Also, the pattern conductors form a plurality of capacitors. The inductors and capacitors form a band pass filter.

In the multilayer electronic component including the shield electrodes on the side surfaces of the multilayer body as described above, a case is considered in which via conductors provide coupling between the pattern conductors and outer electrodes. In this case, an outer electrode may be, for example, a Land Grid Array (LGA) in which a plurality of pad electrodes including signal electrodes and ground electrodes are arranged on a bottom surface of a multilayer body in a predetermined array.

In such a multilayer electronic component, when it is desirable to decrease an unintentional stray capacitance between a via conductor and a shield electrode provided near the via conductor in order to decrease a deviation from a design value of filter characteristic, the via conductor is required to be formed at a position as far as possible from the shield electrode. However, when the via conductor is formed within the area of a signal electrode, if the area of the signal electrode is small or if the signal electrode is close to the side surface, the via conductor may not be arranged sufficiently far from the shield electrode. In this case, the stray capacitance between the via conductor and the shield electrode provided near the via conductor may not be decreased.

SUMMARY OF THE INVENTION

Accordingly, preferred embodiments of the present invention provide multilayer electronic components with a small stray capacitance between a via conductor that couples a pattern conductor provided in a multilayer body with a signal electrode provided on a bottom surface of the multilayer body, and a shield electrode provided near the via conductor.

With preferred embodiments of the present invention, the arrangement of the via conductor is improved so that stray capacitance between the via conductor and the shield electrode provided near the via conductor is decreased.

According to a preferred embodiment of the present invention, a multilayer electronic component includes a multilayer body that is an electronic component element body; a shield electrode; and an outer electrode including a signal electrode and a ground electrode. The multilayer body has a rectangular or substantially rectangular-parallelepiped shape including a first principal surface, a second principal surface, and four side surfaces coupling the first principal surface with the second principal surface. Also, the multilayer body includes therein a first pattern conductor parallel or substantially parallel to the first principal surface and the second principal surface, and a first via conductor and a second via conductor perpendicular or substantially perpendicular to the first principal surface and the second principal surface. The shield electrode is provided on at least one of the side surfaces. The outer electrode is provided on the second principal surface. The outer electrode may be, for example, an LGA as described above; however, it is not limited thereto.

A first end of the first via conductor is electrically coupled with the signal electrode within an area of the signal electrode, and a second end of the first via conductor is electrically coupled with the first pattern conductor on a side of the second principal surface. A first end of the second via conductor is electrically coupled with the first pattern conductor on a side of the first principal surface. The first pattern conductor extends such that, in a view from the first principal surface, a distance between the second via conductor and the shield electrode is larger than a distance between the first via conductor and the shield electrode, and at least a portion of a coupling portion between the second via conductor and the first pattern conductor is outside the area of the signal electrode with which the first via conductor is electrically coupled.

With the multilayer electronic component having the above-described configuration, the via conductor that couples the pattern conductor in the multilayer body with the signal electrode provided on the bottom surface of the multilayer body is divided into the first via conductor and the second via conductor. The second via conductor is electrically coupled with the first pattern conductor having the above-described feature, and hence is sufficiently far from the shield electrode provided near the second via conductor. Accordingly, even if the signal electrode has a small area or the signal electrode is near the side surface, the stray capacitance between the via conductor and the shield electrode is small.

A multilayer electronic component according to a preferred embodiment of the present invention may desirably have a length of the second via conductor which is larger than a length of the first via conductor.

With the multilayer electronic component having the above-described configuration, since the ratio of the second via conductor sufficiently far from the shield electrode is higher than the ratio of the first via conductor, stray capacitance between the via conductor and the shield electrode is reliably decreased.

A multilayer electronic component according to a preferred embodiment of the present invention may include the multilayer body with a second pattern conductor parallel or substantially parallel to the first principal surface and the second principal surface. The second pattern conductor may be electrically coupled with a second end of the second via conductor on the side of the second principal surface, and the second pattern conductor may define an inductor or a capacitor.

With the multilayer electronic component having the above-described configuration, the stray capacitance between the via conductor and the shield electrode is small, as described above. Accordingly, when the second pattern conductor defines, for example, an inductor or a capacitor in a circuit of an LC parallel resonator and the multilayer electronic component is a multilayer band pass filter, a deviation from the design value of filter characteristic is small.

A multilayer electronic component according to a preferred embodiment of the present invention may further include the shield electrode provided on each of the four side surfaces of the multilayer body.

With the multilayer electronic component having the above-described configuration, the influence of noise from the outside is effectively reduced or prevented.

A multilayer electronic component according to a preferred embodiment of the present invention may further include the multilayer body with a third pattern conductor parallel or substantially parallel to the first principal surface and the second principal surface, and a third via conductor perpendicular or substantially perpendicular to the first principal surface and the second principal surface. A first end of the third via conductor may be coupled with the ground electrode within an area of the ground electrode, and a second end of the third via conductor may be coupled with the third pattern conductor on the side of the second principal surface. An end of the third pattern conductor may be coupled with the shield electrode.

With the multilayer electronic component having the above-described configuration, the shield electrode and the ground electrode are isolated from one another on the outer surface of the multilayer electronic component. That is, when the outer electrode including the ground conductor is electrically coupled by soldering with a mount electrode on a circuit board of an electronic device, wetting-up of solder to the shield electrode is significantly reduced or prevented. As the result, continuity due to the wet-up solder between the multilayer electronic component according to a preferred embodiment of the present invention and another electronic component is significantly reduced or prevented. Accordingly, a multilayer electronic component according to a preferred embodiment of the present invention and another electronic component are able to be mounted with high density.

A multilayer electronic component according to a preferred embodiment of the present invention may further include the shield electrode with a first portion and a second portion including a first end electrically coupled with the first portion and a second end reaching the second principal surface of the multilayer body. The ground electrode may include a first portion and a second portion including a first end electrically coupled with the first portion and a second end reaching the side surface provided with the second portion of the shield electrode. The second portion of the shield electrode may be coupled with the second portion of the ground electrode.

With the multilayer electronic component having the above-described configuration, the shield electrode and the ground electrode are directly coupled with one another on the outer surface of the multilayer electronic component. As the result, the pattern conductor and the via conductor that couples the shield electrode with the ground electrode may not be provided in the multilayer body. Hence, the degree of flexibility in arrangement of the pattern conductors and the via conductors in the multilayer body is able to be increased. Alternatively, this structure may be provided in addition to the structure in which the pattern conductor and the via conductor that couples the shield electrode with the ground electrode is provided in the multilayer body. In this case, the grounding effect is able to be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The features of the present invention are described below in further detail with reference to preferred embodiments of the present invention. Multilayer electronic components to which preferred embodiments of the present invention are applied may be, for example, a multilayer band pass filter; however, it is not limited thereto.

A multilayer electronic component 100 according to a preferred embodiment of the present invention is described with reference to FIGS. 1 to 2B. The figures show only primary portions. In addition to the illustrated primary portions, multiple pattern conductors and multiple via conductors that define a circuit are present in a multilayer body (described later). However, the specific diagrams for all of the multiple pattern conductors and multiple via conductors that define a circuit are not particularly described or illustrated for the sake of simplicity. Also, the figures described later only illustrate the primary portions similarly.

Also, the figures do not reflect variations in shape generated in manufacturing of a shield electrode, an outer electrode, a pattern conductor, a via conductor, and a multilayer body. That is, the figures express an actual product in terms of essence even if the figures involve structures which may be different from the actual product.

Figure 1:
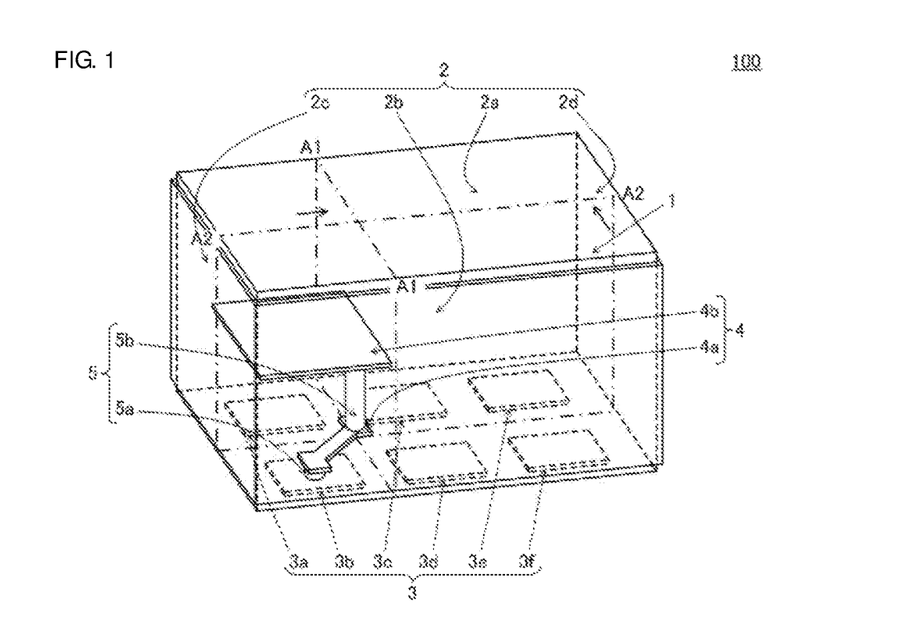
FIG. 1 is a transparent perspective view showing a primary portion of a multilayer electronic component being a multilayer electronic component according to a preferred embodiment of the present invention.
Figure 2A:
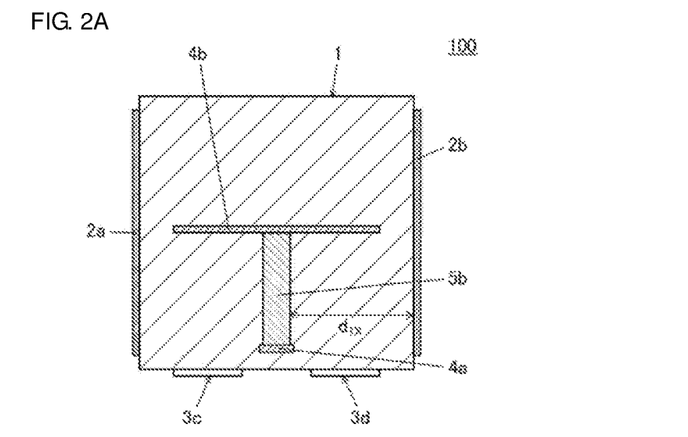
FIGS. 2A and 2B are cross-sectional arrow views taken along cut planes shown in FIG. 1 of the primary portion of the multilayer electronic component.
Figure 2B:
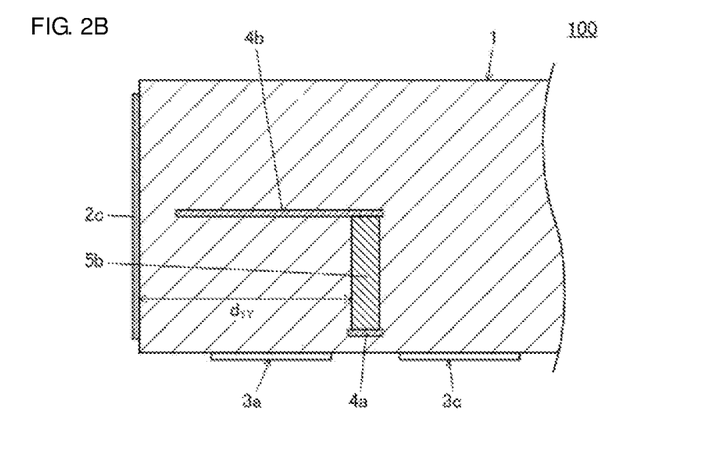

FIG. 1 is a transparent perspective view showing a primary portion of the multilayer electronic component 100. FIG. 2A is a cross-sectional arrow view showing the primary portion of the multilayer electronic component 100 taken along a plane containing line A1-A1 (indicated by a dotted-chain line) shown in FIG. 1. FIG. 2B is a cross-sectional arrow view showing the primary portion of the multilayer electronic component 100 taken along a plane containing line A2-A2 (indicated by a dotted-chain line) shown in FIG. 1 similarly. FIGS. 1 to 2B do not illustrate a coupling structure between a shield electrode and a ground electrode (described later, see FIGS. 5 and 6).

The multilayer electronic component 100 preferably includes a multilayer body 1 that is an electronic component element body, a shield electrode 2, and an outer electrode 3. The multilayer body 1 has a rectangular-parallelepiped or substantially rectangular-parallelepiped shape including a first principal surface, a second principal surface, and four side surfaces coupling the first principal surface with the second principal surface. In FIG. 1, the first principal surface corresponds to a top surface and the second principal surface corresponds to a bottom surface in the figure.

The multilayer body 1 preferably includes a dielectric layer (no reference sign), a pattern conductor 4 parallel or substantially parallel to the first principal surface and the second principal surface and including a first pattern conductor 4a and a second pattern conductor 4b, and a via conductor 5 perpendicular or substantially perpendicular to the first principal surface and the second principal surface and including a first via conductor 5a and a second via conductor 5b. The dielectric layer is preferably made of, for example, a low-temperature fired ceramic material. The pattern conductor 4 and the via conductor 5 are preferably made of, for example, Cu. As described above, multiple pattern conductors and multiple via conductors other than those described above are present in the multilayer body 1. For example, the pattern conductors and the via conductors define an LC parallel resonator.

The shield electrode 2 preferably includes a first shield electrode 2a, a second shield electrode 2b, a third shield electrode 2c, and a fourth shield electrode 2d. The shield electrodes are preferably made of, for example, Cu, and are respectively provided on the four side surfaces of the multilayer body 1 one by one. This case is desirable because the influence of noise from the outside is effectively reduced or prevented. However, the number of the shield electrodes of the multilayer electronic component 100 is not limited to four, and the shield electrodes may be provided at required portions among the four side surfaces. Also, in the multilayer electronic component 100, the shield electrodes are preferably electrically coupled with one another at ridge portions of the multilayer body 1; however, the shield electrodes may be provided in a separated state.

The outer electrode 3 is preferably an LGA, for example. A first signal electrode 3a, a second signal electrode 3b, a third signal electrode 3e, and a fourth signal electrode 3f, as well as a first ground electrode 3c and a second ground electrode 3d are preferably provided on the bottom surface of the multilayer body in an arranged state with a predetermined array. In the multilayer electronic component 100, a substantially matrix-shaped array is preferably included; however, it is not limited thereto. The outer electrode 3 of the multilayer electronic component 100 is not required to include the six electrodes, and may include a number of electrodes required to define a desired circuit. The outer electrode is not limited to an LGA. For example, solder bumps arranged in a predetermined array may alternatively be used.

In the multilayer electronic component 100, in a view from the first principal surface of the multilayer body 1, the first pattern conductor 4a is a strip-shaped or substantially strip-shaped conductor extending in a direction in which the position of the center of gravity of the second signal electrode 3b is connected with the position of the center of gravity of the first ground electrode 3c. The first pattern conductor 4a preferably includes a first end portion and a second end portion that are coupling regions. However, the extending direction is not limited thereto. Also, the second pattern conductor 4b is, for example, a pattern conductor defining a capacitor in the circuit of the LC parallel resonator.

In the multilayer electronic component 100, a first end of the first via conductor 5a is preferably coupled with the second signal electrode 3b at the position of the center of gravity of the second signal electrode 3b. However, the coupling portion is not limited thereto, and may be at any position within the area of the second signal electrode 3b. Also, a second end of the first via conductor 5a is electrically coupled with the first end portion of the first pattern conductor 4a on the side of the second principal surface, that is, the bottom surface of the multilayer body 1. Alternatively, the coupling portion between the second end of the first via conductor 5a and the first pattern conductor 4a may be at a position shifted from the first end portion of the first pattern conductor 4a toward the center.

In the multilayer electronic component 100, in a view from the first principal surface of the multilayer body 1, a first end of the second via conductor 5b is electrically coupled with the second end portion of the first pattern conductor 4a outside the area of the second signal electrode 3b on the side of the first principal surface, that is, the top surface of the multilayer body 1. Hence, the shield electrodes provided near the first via conductor 5a and the second via conductor 5b are the second shield electrode 2b and the third shield electrode 2c.

The first pattern conductor 4a extends such that, in a view from the first principal surface of the multilayer body 1, a distance $d_{1X}$ between the second via conductor 5b and the second shield electrode 2b is larger than a distance $d_{2X}$ (described later) between the first via conductor 5a and the second shield electrode 2b, a distance $d_{1Y}$ between the second via conductor 5b and the third shield electrode 2c is larger than a distance $d_{2Y}$ (described later) between the first via conductor 5a and the third shield electrode 2c, and the coupling portion between the second via conductor 5b and the first pattern conductor 4a is located outside the area of the second signal electrode 3b with which the first via conductor 5a is electrically coupled (see FIGS. 2A and 2B).

Alternatively, the coupling portion between the first end of the second via conductor 5b and the second end portion of the first pattern conductor 4a may partly overlap the area of the second signal electrode 3b. The coupling portion between the first end of the second via conductor 5b and the first pattern conductor 4a may be at a position shifted from the second end portion of the first pattern conductor 4a toward the center.

Figure 3:
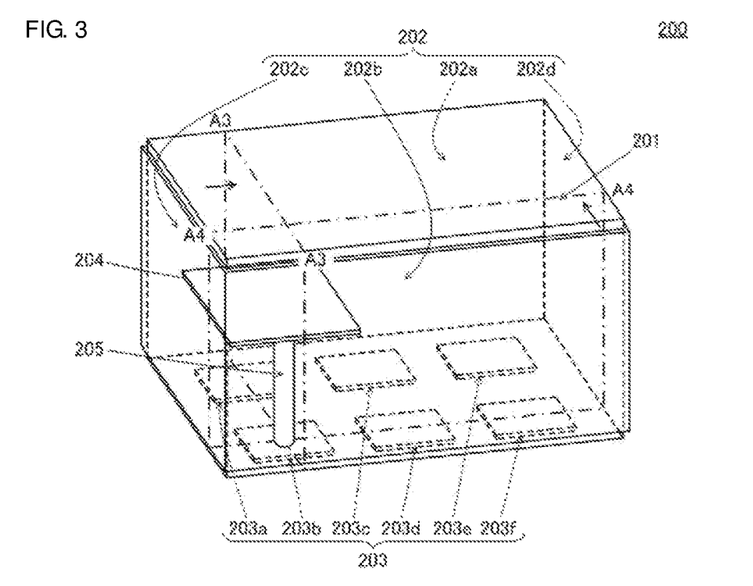
FIG. 3 is a transparent perspective view showing a primary portion of a multilayer electronic component being a comparative example for a multilayer electronic component of a preferred embodiment of the present invention.
Figure 4A:
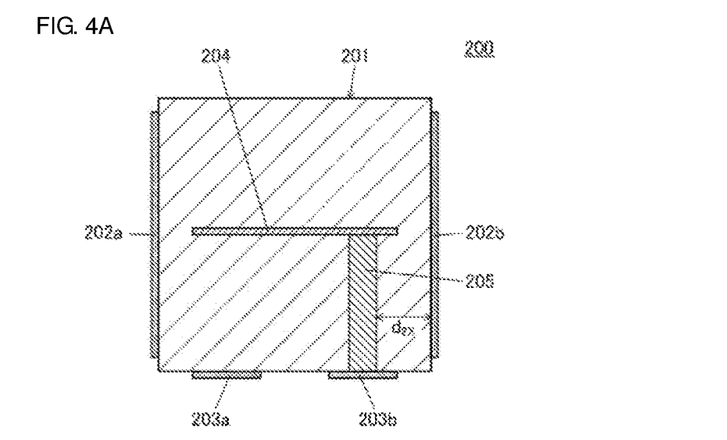
FIGS. 4A and 4B are cross-sectional arrow views taken along cut planes shown in FIG. 3 of the primary portion of the multilayer electronic component.
Figure 4B:
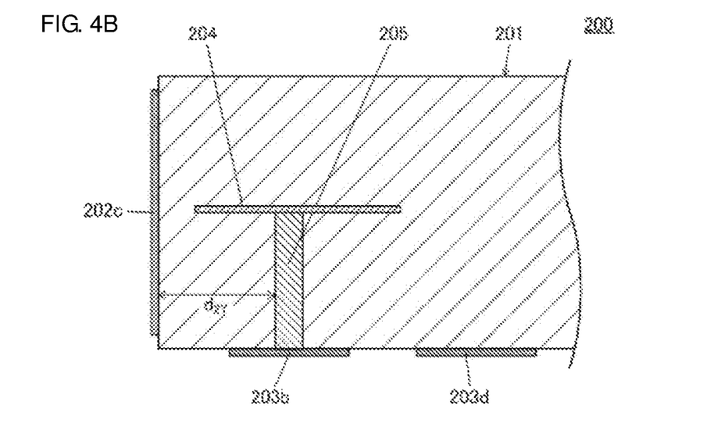

This is described below by using a multilayer electronic component 200 that is a comparative example for the multilayer electronic component 100. FIG. 3 is a transparent perspective view of the multilayer electronic component 200. FIG. 4A is a cross-sectional arrow view showing a primary portion of the multilayer electronic component 200 taken along a plane containing line A3-A3 (indicated by a dotted-chain line) shown in FIG. 3. FIG. 4B is a cross-sectional arrow view showing the primary portion of the multilayer electronic component 200 taken along a plane containing line A4-A4 (indicated by a dotted-chain line) shown in FIG. 3 similarly.

The multilayer electronic component 200 preferably includes a multilayer body 201 that is an electronic component element body, a shield electrode 202 (a first shield electrode 202a to a fourth shield electrode 202d), and an outer electrode 203 (a first signal electrode 203a, a second signal electrode 203b, a third signal electrode 203e, and a fourth signal electrode 203f, as well as a first ground electrode 203c and a second ground electrode 203d). The multilayer body 201 includes therein a pattern conductor 204 parallel or substantially parallel to a first principal surface and a second principal surface, and a via conductor 205 perpendicular or substantially perpendicular to the first principal surface and the second principal surface. The shield electrode 202 and the outer electrode 203 are preferably similar to those of the multilayer electronic component 100 according to the present preferred embodiment of the present invention.

In the multilayer electronic component 200, a first end of the via conductor 205 is electrically coupled with the second signal electrode 203b at the position of the center of gravity of the second signal electrode 203b. That is, the shield electrodes provided near the via conductor 205 are the second shield electrode 202b and the third shield electrode 202c similarly to the multilayer electronic component 100.

At this time, the distance between the via conductor 205 and the second shield electrode 202b is $d_{2X}$, and this corresponds to the distance between the first via conductor 5a and the second shield electrode 2b of the multilayer electronic component 100. Also, the distance between the via conductor 205 and the third shield electrode 202c is $d_{2Y}$, and this corresponds to the distance between the first via conductor 5a and the third shield electrode 2c of the multilayer electronic component 100 (see FIGS. 4A and 4B).

In this case, a stray capacitance is generated between the entire via conductor 205 and the second shield electrode 202b, and between the entire via conductor 205 and the third shield electrode 202c. The size of this stray capacitance may be a factor of a deviation from the design value of filter characteristic as the relative permittivity of the dielectric material of the multilayer body 201 increases.

In contrast, with the multilayer electronic component 100 according to a preferred embodiment of the present invention as described above, the distances of the second via conductor 5b with respect to the second shield electrode 2b and the third shield electrode 2c are larger than the distances of the first via conductor 5a with respect to the second shield electrode 2b and the third shield electrode 2c by the first pattern conductor 4a. Since an electrostatic capacity is inversely proportional to the distance between conductors, the size of the stray capacitance generated between the second via conductor 5b and the above-described shield electrodes is small.

Hence, the sizes of the stray capacitances generated between the first and second via conductors 5a and 5b and the shield electrodes provided near the first and second via conductors 5a and 5b in the multilayer electronic component 100 are smaller than the size of the stray capacitance generated between the via conductor 205 and the shield electrodes provided near the via conductor 205 in the multilayer electronic component 200. That is, a deviation from the design value of filter characteristic of the multilayer electronic component 100 is small.

Figure 5:
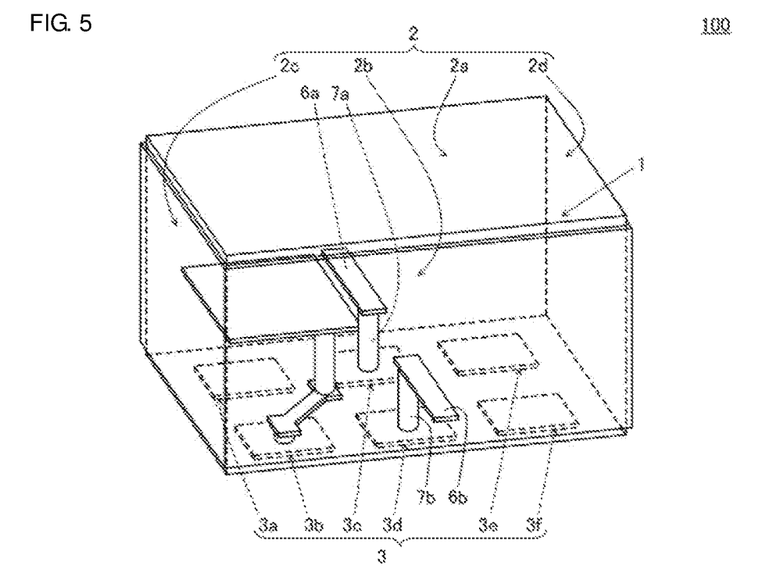
FIG. 5 is a transparent perspective view focusing on a coupling structure between a shield electrode and a ground electrode according to a preferred embodiment of the present invention.
Figure 6:
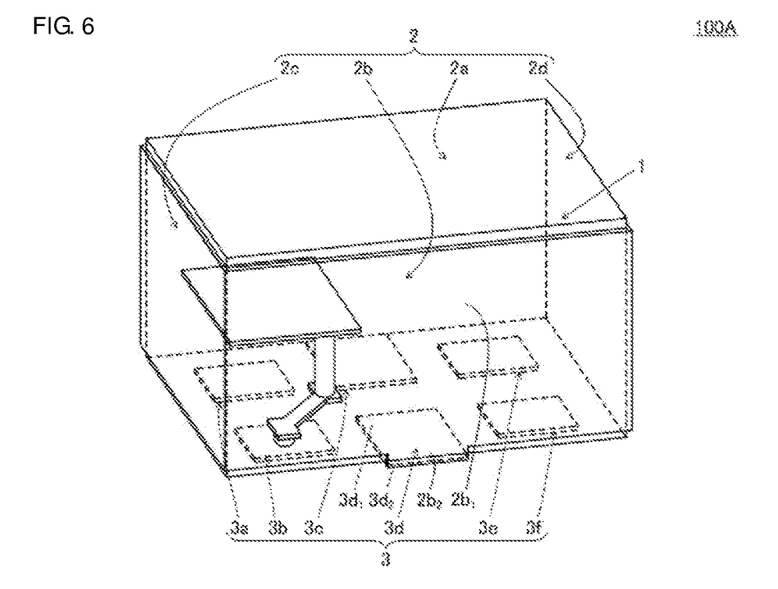
FIG. 6 is a transparent perspective view focusing on a coupling structure between a shield electrode and a ground electrode of a multilayer electronic component of another preferred embodiment of the present invention being different from the multilayer electronic component of the previous preferred embodiment of the present invention only in the coupling structure between the shield electrode and the ground electrode.

A coupling structure between a shield electrode and a ground electrode in the multilayer electronic component according to a preferred embodiment of the present invention is described now with reference to FIGS. 5 and 6. FIG. 5 is a transparent perspective view focusing on a coupling structure between a shield electrode and a ground electrode in the multilayer electronic component 100. As shown in FIG. 5, the multilayer body 1 preferably includes therein third pattern conductors 6a and 6b parallel or substantially parallel to the first principal surface and the second principal surface, and third via conductors 7a and 7b perpendicular or substantially perpendicular to the first principal surface and the second principal surface.

A first end of the third via conductor 7b is electrically coupled with the second ground electrode 3d within the area of the second ground electrode 3d. A second end of the third via conductor 7b is electrically coupled with the third pattern conductor 6b on the side of the second principal surface. An end of the third pattern conductor 6b is electrically coupled with the second shield electrode 2b. Also, the third pattern conductor 6a and the third via conductor 7a preferably have a positional relationship similar to the above-described relationship. The third via conductor 7a is electrically coupled with the first ground electrode 3c, and an end of the third pattern conductor 6a is electrically coupled with the first shield electrode 2a.

With this coupling structure, when the first ground electrode 3c and the second ground electrode 3d are coupled by soldering with a mount electrode on a circuit board of a corresponding electronic device, wetting-up of solder to the first shield electrode 2a and the second shield electrode 2b is significantly reduced or prevented. As the result, continuity due to the wet-up solder (solder bridge) between the multilayer electronic component 100 and another electronic component is significantly reduced or prevented. Accordingly, the multilayer electronic component 100 and another electronic component are able to be mounted with high density.

FIG. 6 is a transparent perspective view focusing on a coupling structure between a shield electrode and a ground electrode of a multilayer electronic component 100A preferably being different from the multilayer electronic component 100 only in the coupling structure between the shield electrode and the ground electrode. As shown in FIG. 6, the second shield electrode 2b preferably includes a first portion $2b_1$ and a second portion $2b_2$ including a first end electrically coupled with the first portion $2b_1$ and a second end reaching the second principal surface of the multilayer body 1. Also, the first shield electrode 2a preferably includes a first portion and a second portion (not labeled) including a structure similar to the above-described structure.

The second ground electrode 3d preferably includes a first portion $3d_1$ and a second portion $3d_2$ including a first end electrically coupled with the first portion $3d_1$ and a second end reaching the side surface provided with the second shield electrode 2b. In the multilayer electronic component 100A, the first portion $3d_1$ and the second portion $3d_2$ preferably have the same width; however, they may have different widths if desirable. Also, the second portion $2b_2$ of the second shield electrode 2b and the second portion $3d_2$ of the second ground electrode 3d preferably have the same width; however, may they may have different widths if so desirable. The second portion $2b_2$ of the second shield electrode 2b is electrically coupled with the second portion $3d_2$ of the second ground electrode 3d.

Also, the first ground electrode 3c preferably has a structure similar to the structure of the second ground electrode 3d, and includes a first portion and a second portion (not labeled). The second portion $2a_2$ of the first shield electrode 2a is electrically coupled with the second portion $3c_2$ of the first ground electrode 3c.

With this coupling structure, the pattern conductor and the via conductor that couples the first shield electrode 2a with the first ground electrode 3c, or the pattern conductor and the via conductor that couples the second shield electrode 2b with the second ground electrode 3d may not be provided in the multilayer body 1. Hence, the degree of flexibility in arrangement of the pattern conductors and the via conductors in the multilayer body 1 is able to be increased.

A multilayer electronic component 100B according to a first modification and a multilayer electronic component 100C according to a second modification of a multilayer electronic component according to a preferred embodiment of the present invention are described with reference to FIGS. 7A and 7B. The multilayer electronic components 100B and 100C are different from the multilayer electronic component 100 in the shape of the first pattern conductor 4a. The other components are similar to those of the multilayer electronic component 100, and hence the description on the common components have been occasionally omitted or simplified for the sake of brevity. In the following explanation, the description on the common components is also omitted or simplified.

Figure 7A:
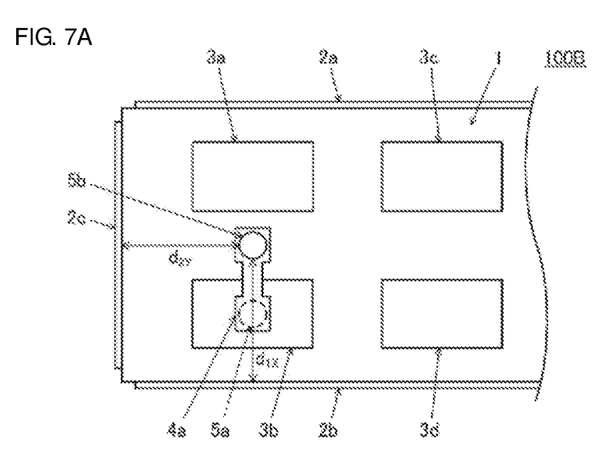
FIGS. 7A and 7B are transparent plan views of a multilayer electronic component being a first modification and a multilayer electronic component being a second modification of a multilayer electronic component according to a preferred embodiment of the present invention, from a top surface.
Figure 7B:
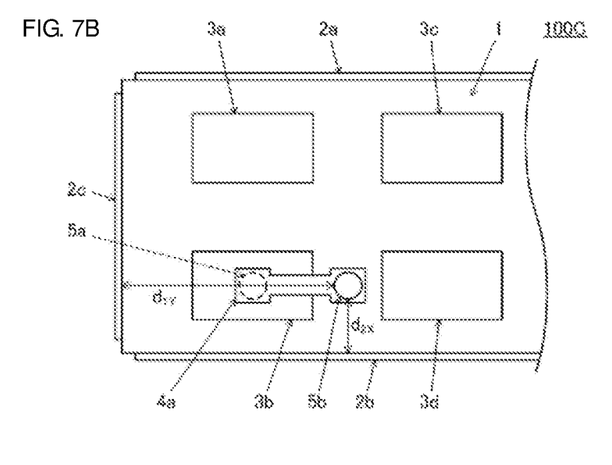

FIG. 7A is a transparent plan view of the multilayer electronic component 100B being the first modification of the multilayer electronic component according to a preferred embodiment of the present invention, from the top surface. FIG. 7B is a transparent plan view of the multilayer electronic component 100C being the second modification of the multilayer electronic component according to a preferred embodiment of the present invention, from the top surface.

In the multilayer electronic component 100B, in a view from the first principal surface of the multilayer body 1, the distance between the second via conductor 5b and a shield electrode provided near the second via conductor 5b is larger than the distance between the first via conductor 5a and the same shield electrode. In the multilayer electronic component 100B, a distance $d_{1X}$ between the second via conductor 5b and the second shield electrode 2b is larger than a distance $d_{2X}$ between the first via conductor 5a and the second shield electrode 2b; however, the distance between the second via conductor 5b and the third shield electrode 2c is the same as a distance $d_{2Y}$ between the first via conductor 5a and the third shield electrode 2c. The first via conductor 5a and the second via conductor 5b are arranged in a straight line parallel or substantially parallel to the third shield electrode 2c.

In the multilayer electronic component 100C, a distance $d_{1Y}$ between the second via conductor 5b and the third shield electrode 2c is preferably larger than a distance $d_{2Y}$ between the first via conductor 5a and the third shield electrode 2c, and the distance between the second via conductor 5b and the second shield electrode 2b may be the same as a distance $d_{2X}$ between the first via conductor 5a and the second shield electrode 2b. However, it is more effective to shift the arrangement position of the second via conductor 5b by the first pattern conductor 4a to increase the distance between the first via conductor 5a and the close shield electrode (the second shield electrode 2b) like the multilayer electronic component 100C. The first via conductor 5a and the second via conductor 5b are arranged in a straight line parallel or substantially parallel to the second shield electrode 2b.

Modification of a multilayer electronic component 100D that is a third modification of a multilayer electronic component according to a preferred embodiment of the present invention is described with reference to FIG. 8. The multilayer electronic component 100D is different from the multilayer electronic component 100 in the shape of the second pattern conductor 4b. The other components are similar to those of the multilayer electronic component 100.

Figure 8:
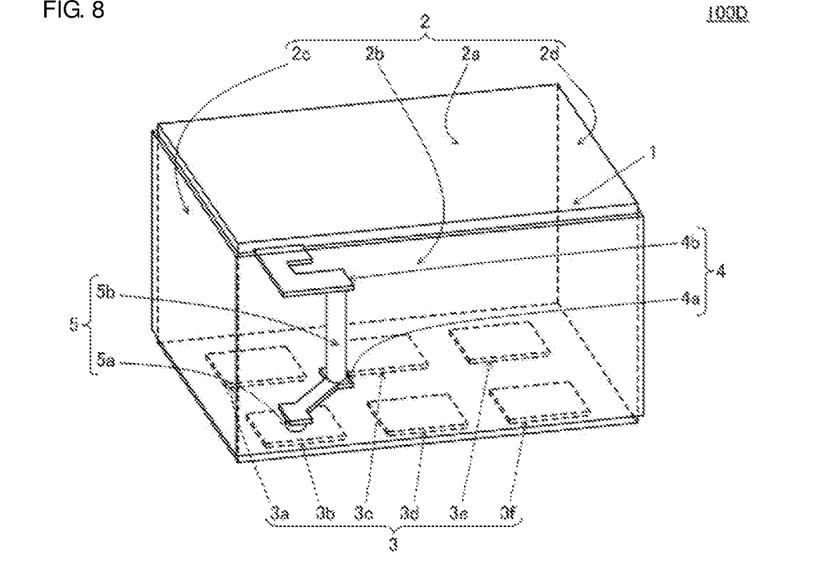
FIG. 8 is a transparent perspective view of a multilayer electronic component being a third modification of a multilayer electronic component according to a preferred embodiment of the present invention.

FIG. 8 is a transparent perspective view of the multilayer electronic component 100D of the third modification of a multilayer electronic component according to a preferred embodiment of the present invention. The second pattern conductor 4b is preferably, for example, a pattern conductor that defines the capacitor in the circuit of the LC parallel resonator in the multilayer electronic component 100. However, the second pattern conductor 4b is a pattern conductor that defines an inductor in the multilayer electronic component 100D.

Even in this case, the first pattern conductor 4a extends such that the distance between the second via conductor 5b and the second shield electrode 2b is larger than the distance between the first via conductor 5a and the second shield electrode 2b, and the distance between the second via conductor 5b and the third shield electrode 2c is larger than the distance between the first via conductor 5a and the third shield electrode 2c. The distance between the second via conductor 5b and a shield electrode may be larger like the above-described first and second modifications.

When the arrangement position of the second via conductor 5b is shifted from the arrangement position of the first via conductor 5a by the first pattern conductor 4a, the arrangement position of the second pattern conductor 4b is also shifted at the same time so that the distances between the second pattern conductor 4b and the second and third shield electrodes 2b and 2c are increased. Further, the shape of the second pattern conductor 4b is adjusted so that the lengths of the regions where the second pattern conductor 4b faces the second and third shield electrodes 2b and 2c are decreased.

Accordingly, the size of the stray capacitance generated between the second pattern conductor 4b and the second and third shield electrodes 2b and 2c is small.

Hence, the size of the stray capacitance generated between the second pattern conductor 4b, the first via conductor 5a, and the second via conductor 5b; and the shield electrode provided near these conductors is able to be sufficiently decreased in the multilayer electronic component 100D. That is, a deviation from the design value of filter characteristic of the multilayer electronic component 100D is sufficiently small.

The present invention is not limited to the above-described preferred embodiments and various applications and modifications are within the scope of the present invention. Also, the respective preferred embodiments described in this specification are merely examples, and it should be noted that the configurations thereof are able to be partly replaced or combined among the different preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer electronic component, comprising:
a multilayer body that is an electronic component element body;
a shield electrode; and
an outer electrode including a signal electrode and a ground electrode; wherein
the multilayer body has a rectangular-parallelepiped or substantially rectangular-parallelepiped shape including a first principal surface, a second principal surface, and four side surfaces connecting the first principal surface with the second principal surface, and includes therein a first pattern conductor parallel or substantially parallel to the first principal surface and the second principal surface, and a first via conductor and a second via conductor perpendicular or substantially perpendicular to the first principal surface and the second principal surface;
the shield electrode is provided on at least one of the four side surfaces;
the outer electrode is provided on the second principal surface;
a first end of the first via conductor is electrically coupled with the signal electrode within an area of the signal electrode, and a second end of the first via conductor is electrically coupled with the first pattern conductor on a side of the second principal surface;
a first end of the second via conductor is electrically coupled with the first pattern conductor on a side of the first principal surface; and
the first pattern conductor extends such that, in a view from the first principal surface, a distance between the second via conductor and the shield electrode is larger than a distance between the first via conductor and the shield electrode, and at least a portion of a coupling portion between the second via conductor and the first pattern conductor is outside the area of the signal electrode with which the first via conductor is electrically coupled.

2. The multilayer electronic component according to claim 1, wherein a length of the second via conductor is larger than a length of the first via conductor.

3. The multilayer electronic component according to claim 1, wherein the multilayer body further includes a second pattern conductor parallel or substantially parallel to the first principal surface and the second principal surface, the second pattern conductor is electrically coupled with a second end of the second via conductor on the side of the second principal surface, and the second pattern conductor defines an inductor or a capacitor.

4. The multilayer electronic component according to claim 1, wherein the shield electrode includes four shield electrodes respectively provided on each of the four side surfaces.

5. The multilayer electronic component according to claim 1, wherein
the multilayer body includes a third pattern conductor parallel or substantially parallel to the first principal surface and the second principal surface, and a third via conductor perpendicular or substantially perpendicular to the first principal surface and the second principal surface;
a first end of the third via conductor is electrically coupled with the ground electrode within an area of the ground electrode, and a second end of the third via conductor is electrically coupled with the third pattern conductor on the side of the second principal surface; and
an end of the third pattern conductor is electrically coupled with the shield electrode.

6. The multilayer electronic component according to claim 1, wherein
the shield electrode includes a first portion and a second portion including a first end electrically coupled with the first portion and a second end reaching the second principal surface;
the ground electrode includes a first portion and a second portion including a first end electrically coupled with the first portion and a second end reaching the side surface provided with the second portion of the shield electrode; and
the second portion of the shield electrode is electrically coupled with the second portion of the ground electrode.

7. The multilayer electronic component according to claim 5, wherein the third pattern conductor includes two third pattern conductors.

8. The multilayer electronic component according to claim 5, wherein the shield electrode includes four shield electrodes respectively provided on each of the four side surfaces.

9. The multilayer electronic component according to claim 7, wherein
the shield electrode includes four shield electrodes respectively provided on each of the four side surfaces; and
one of the two third pattern conductors is connected to one of the four shield electrodes and another one of the two third pattern conductors is connected to another one of the four shield electrodes.

10. The multilayer electronic component according to claim 9, wherein the one of the four shield electrodes is provided on a side of the multilayer body opposite to a side of the multilayer body on which the another one of the four shield electrodes is provided.

11. The multilayer electronic component according to claim 1, wherein the first via conductor and the second via conductor are arranged in a straight line parallel or substantially parallel to at least one of the four side surfaces.

12. The multilayer electronic component according to claim 1, wherein the first via conductor and the second via conductor are spaced away from one of the four side surfaces by an equal distance.

13. The multilayer electronic component according to claim 1, wherein the ground electrode includes a plurality of ground electrodes.

14. The multilayer electronic component according to claim 5, wherein the ground electrode includes a plurality of ground electrodes.

15. The multilayer electronic component according to claim 14, wherein the third pattern conductor includes two third pattern conductors.

16. The multilayer electronic component according to claim 14, wherein the shield electrode includes four shield electrodes respectively provided on each of the four side surfaces.

17. The multilayer electronic component according to claim 15, wherein the shield electrode includes four shield electrodes respectively provided on each of the four side surfaces; and
one of the two third pattern conductors is connected to one of the four shield electrodes and another one of the two third pattern conductors is connected to another one of the four shield electrodes.

18. The multilayer electronic component according to claim 17, wherein the one of the four shield electrodes is provided on a side of the multilayer body opposite to a side of the multilayer body on which the another one of the four shield electrodes is provided.

19. The multilayer electronic component according to claim 1, wherein the signal electrode includes a plurality of signal electrodes.

20. The multilayer electronic component according to claim 6, wherein the signal electrode includes a plurality of signal electrodes.

* * * * *